(12) United States Patent
Kalva et al.

(10) Patent No.: US 12,355,947 B1
(45) Date of Patent: *Jul. 8, 2025

(54) METHODS AND SYSTEMS FOR COMBINED LOSSLESS AND LOSSY CODING

(71) Applicant: OP Solutions, LLC, Amherst, MA (US)

(72) Inventors: Hari Kalva, Boca Raton, FL (US);
Borivoje Furht, Boca Raton, FL (US);
Velibor Adzic, Canton, GA (US)

(73) Assignee: OP Solutions, LLC, Amherst, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/586,961

(22) Filed: Feb. 26, 2024

Related U.S. Application Data (63) Continuation of application No. 17/840,026, filed on Jun. 14, 2022, now Pat. No. 11,930,163.

(51) Int. Cl.
| | |
|---|---|
| *H04N 19/176* | (2014.01) |
| *H03M 7/30* | (2006.01) |
| *H04N 19/105* | (2014.01) |
| *H04N 19/159* | (2014.01) |
| *H04N 19/60* | (2014.01) |

(52) U.S. Cl.
CPC ........ *H04N 19/105* (2014.11); *H03M 7/3053* (2013.01); *H03M 7/3059* (2013.01); *H03M 7/6005* (2013.01); *H04N 19/159* (2014.11); *H04N 19/176* (2014.11); *H04N 19/60* (2014.11); *H03M 7/6011* (2013.01)

(58) Field of Classification Search
CPC ............... H04N 19/105; H04N 19/159
See application file for complete search history.

(56) References Cited

U.S. PATENT DOCUMENTS

| | | | | |
|---|---|---|---|---|
| 9,491,457 | B2 * | 11/2016 | Wang | H04N 19/107 |
| 9,716,894 | B2 * | 7/2017 | Joshi | H04N 19/467 |
| 11,140,403 | B2 * | 10/2021 | Choi | H04N 19/70 |
| 11,317,090 | B2 * | 4/2022 | Xu | H04N 19/463 |
| 11,431,972 | B2 * | 8/2022 | Aono | H04N 19/119 |
| 2013/0003838 | A1 * | 1/2013 | Gao | H04N 19/46 |
| | | | | 375/240.18 |
| 2013/0114716 | A1 * | 5/2013 | Gao | H04N 19/182 |
| | | | | 375/240.14 |
| 2013/0343448 | A1 * | 12/2013 | He | H04N 19/122 |
| | | | | 375/240.03 |
| 2014/0092963 | A1 * | 4/2014 | Wang | H04N 19/70 |
| | | | | 375/240.12 |

(Continued)

*Primary Examiner* — Irfan Habib
(74) *Attorney, Agent, or Firm* — OP Solutions IP Department; Paul Ackerman (57) ABSTRACT

An encoder includes circuitry configured to receive a video signal and generate an encoded bitstream for decoding by a decoder which identifies, in the bitstream, a current frame, wherein the current frame includes a plurality of regions, detect, in the bitstream, an indication that a first region is encoded according to a lossless encoding protocol and another region is encoded according to a lossy encoding protocol, and decode the current frame, wherein decoding the current frame further comprises decoding the first region using a lossless decoding protocol corresponding to the lossless encoding protocol.

8 Claims, 6 Drawing Sheets

(56) References Cited

U.S. PATENT DOCUMENTS

| | | | | |
|---|---|---|---|---|
| 2014/0286412 A1* | 9/2014 | Joshi | ............... | H04N 19/70 |
| | | | | 375/240.12 |
| 2014/0362917 A1* | 12/2014 | Joshi | ............... | H04N 19/44 |
| | | | | 375/240.12 |
| 2019/0141323 A1* | 5/2019 | Yang | ............... | H04N 19/44 |
| 2020/0275121 A1* | 8/2020 | Zhao | ............... | H04N 19/70 |
| 2020/0366911 A1* | 11/2020 | Choi | ............... | H04N 19/50 |
| 2021/0051346 A1* | 2/2021 | Xu | ............... | H04N 19/70 |
| 2021/0112246 A1* | 4/2021 | Aono | ............... | H04N 19/172 |

* cited by examiner

METHODS AND SYSTEMS FOR COMBINED LOSSLESS AND LOSSY CODING

CROSS-REFERENCE TO RELATED APPLICATIONS

This application is a continuation of application Ser. No. 17/840,026 filed on Jun. 14, 2022, and titled "METHODS AND SYSTEMS FOR COMBINED LOSSLESS AND LOSSY CODING," which application is a continuation of application Ser. No. 17/730,563 filed on Apr. 27, 2022, and titled "METHODS AND SYSTEMS FOR COMBINED LOSSLESS AND LOSSY CODING," now U.S. Pat. No. 11,706,410 which is a continuation of application Ser. No. 17/229,210 filed on Apr. 13, 2021, and titled "METHODS AND SYSTEMS FOR COMBINED LOSSLESS AND LOSSY CODING," now U.S. Pat. No. 11,375,183 which claims the benefit of priority of U.S. Provisional Patent Application Ser. No. 63/009,370, filed on Apr. 13, 2020, and titled "METHODS AND SYSTEMS FOR COMBINED LOSSLESS AND LOSSY CODING." These applications are incorporated by reference herein in their entireties.

FIELD OF THE INVENTION

The present invention generally relates to the field of video compression. In particular, the present invention is directed to methods and systems for combined lossless and lossy coding. BACKGROUND A video codec can include an electronic circuit or software that compresses or decompresses digital video. It can convert uncompressed video to a compressed format or vice versa. In the context of video compression, a device that compresses video (and/or performs some function thereof) can typically be called an encoder, and a device that decompresses video (and/or performs some function thereof) can be called a decoder.

A format of the compressed data can conform to a standard video compression specification. The compression can be lossy in that the compressed video lacks some information present in the original video. A consequence of this can include that decompressed video can have lower quality than the original uncompressed video because there is insufficient information to accurately reconstruct the original video.

There can be complex relationships between the video quality, the amount of data used to represent the video (e.g., determined by the bit rate), the complexity of the encoding and decoding algorithms, sensitivity to data losses and errors, case of editing, random access, end-to-end delay (e.g., latency), and the like.

Motion compensation can include an approach to predict a video frame or a portion thereof given a reference frame, such as previous and/or future frames, by accounting for motion of the camera and/or objects in the video. It can be employed in the encoding and decoding of video data for video compression, for example in the encoding and decoding using the Motion Picture Experts Group (MPEG)'s advanced video coding (AVC) standard (also referred to as H.264). Motion compensation can describe a picture in terms of the transformation of a reference picture to the current picture. The reference picture can be previous in time when compared to the current picture, from the future when compared to the current picture. When images can be accurately synthesized from previously transmitted and/or stored images, compression efficiency can be improved.

SUMMARY OF THE DISCLOSURE

In an aspect, a decoder includes circuitry configured to receive a coded video bitstream, identify, in the bitstream, a current frame, wherein the current frame includes a first region, a second region, and a third region, detect, in the bitstream, first region that the first region is encoded using block differential pulse code modulation, detect, in the bitstream, that the second region is encoded using transform skip residual coding, and detect, in the bitstream, that the third region is encoded using lossy encoding, wherein the lossy encoding includes at least one of inter-prediction and intra-prediction.

In another aspect, a method of combined lossless and lossy coding includes receiving, by a decoder, a coded video bitstream, identifying, by the decoder and in the bitstream, a current frame, wherein the current frame includes a first region, a second region, and a third region, detecting, by the decoder and in the bitstream, that the first region is encoded using block differential pulse code modulation, detecting, by the decoder and in the bitstream, that the second region is encoded using transform skip residual coding, and detecting, by the decoder and in the bitstream, that the third region is encoded using lossy encoding, wherein the lossy encoding includes at least one of inter-prediction and intra-prediction.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

In traditional video coding systems, video sequence is divided into groups-of-pictures (GOP). Each GOP is selfcontained in the sense of temporal and spatial prediction. Usually, first picture in the group is used as a reference picture for the subsequent pictures. Temporal and spatial relationships between the pictures allow for the very efficient compression using predictive coding.

Past coding systems have typically operated using lossy coding, in which some information from an encoded frame is omitted during the encoding process and is not recovered during decoding. Such lossy processes may sacrifice a certain degree of detail and/or resolution in decoded frames and/or video pictures to achieve higher degrees of efficiency, for instance and without limitation by reducing quantities of data transmitted in a bit stream from an encoder to a decoder, processing time and/or memory resources used to encode and/or decode a frame or group of pictures, or the like.

An alternative approach to the above process may include lossless encoding, wherein a frame is encoded and decoded with no or negligible loss of information; this may result in greater resolution and/or other detail in an output frame and/or video picture. However, while lossless encoding and decoding may occasionally be more efficient for certain kinds of image processing as noted in further detail below, lossless encoding can also be very expensive in terms of memory resources and processing times. This is particularly apparent in ultra high definition (UHD) video coding, in which a picture or image size may go up to 8K×4K (7680× 4320); a big picture size may pose great challenge for chip and/or module design. One reason for this is that the UHD requires a bigger search range in motion estimation and on-chip or other processing memory for buffering reference blocks for motion estimation and compensation. UHD processing may even present challenges for lossy encoding and decoding owing to the greater picture sizes involved.

Embodiments disclosed herein enable more efficient signaling, decoding, and encoding using combined lossless and lossy video compression coding. In an embodiment, a picture may first be divided into sub-pictures based on quality and computation requirements. An encoder may create as many sub-pictures as there are processing cores (or hardware threads) on a CPU or other device, circuit, or component that is performing encoding and/or decoding of pictures and/or GOP. Since each sub-picture may be independently coded, this form of task partitioning may allow for efficient encoding and/or decoding by using all available computing resources effectively. Moreover, lossless encoding may furnish better compression than lossy coding that uses transform and quantization, for instance for certain sub-pictures of an overall frame; as a result, combined lossless and lossy coding may result in superior performance to lossless coding alone.

Figure 1:
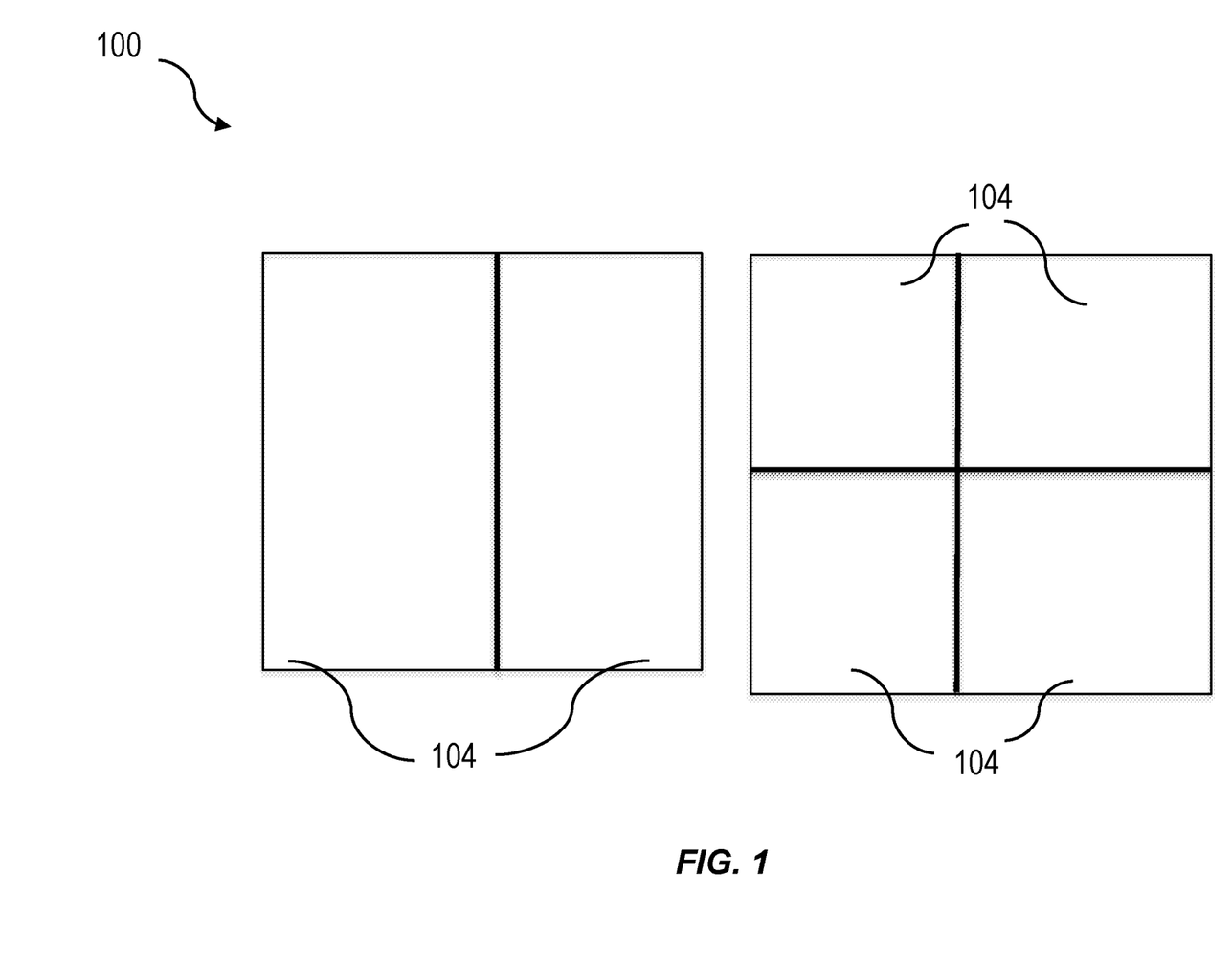
FIG. 1 is a block diagram illustrating an exemplary embodiment of a frame having a plurality of sub-pictures.

Referring now to FIG. 1, an exemplary embodiment of a current frame divided into a plurality of sub-pictures is illustrated. Sub-pictures may include any portion of current frame smaller than current frame; sub-pictures of current frame may combine to cover all of current frame. Although FIG. 1 illustrates exemplary current frames divided into two or four sub-pictures, persons skilled in the art having viewed the entirety of this disclosure will appreciate that any number of sub-pictures may be used as appropriate for resolution, efficiency, or any other consideration.

Still referring to FIG. 1, a sub-picture may have any suitable shape, including without limitation a square and/or rectangular shape, a shape defined by combination of two or more blocks having square and/or rectangular shapes, or the like. Each block may be identified and/or signaled using coordinates of one or more portions and/or features of a block, where coordinates may indicate number of pixels across frame and/or picture as measured from one or more corners and/or sides of the frame and/or picture. For instance, and without limitation, a block may be identified using coordinates of vertices, such as two x coordinates and two y coordinates for identification of a rectangular block. A sub-picture and/or portion thereof may alternatively or additionally be identified using any suitable geometric description of points, lines, and/or shapes, including without limitation geometric partition using one or more line segments, as defined by linear equations or mathematically equivalent expressions such as line-segment endpoints, using one or more curved edges such as without limitation defined using exponential or other curves, or the like.

With continued reference to FIG. 1, sub-pictures may be coded separately from one another. For instance, and without limitation, a first region of a plurality of sub-pictures may be encoded and/or decoded using a first processor thread and a third region element may be decoded using a second processor thread. A "processor thread" as used herein may include any processor core and/or other hardware element capable of executing a thread of a multithreaded parallel process that may occur to persons skilled in the art upon reviewing the entirety of this disclosure. In an embodiment, where each sub-picture is independently coded, this form of task partitioning may allow for efficient encoding by using all available compute resources effectively.

Still referring to FIG. 1 lossless coding may be selectively applied to a subset of blocks of a picture where it is desirable for one or more reasons described above for a source video to be preserved without any loss. As a non-limiting example, selection of a subset of a picture for lossless coding may be done for reasons of coding efficiency. In such cases, lossless coding mode decision may be made after evaluating a rate-distortion (RD) cost of coding a CTU in lossy and lossless modes. In certain use cases, portions of a video may be selected by the user to be encoded in lossless mode for reasons dictated by applications. A non-limiting example may include situations where portion of a frame where source quality retention is desirable for a user. When such user selections are made, an entire region may be marked as using lossless coding without performing any RD analysis.

Figure 2:
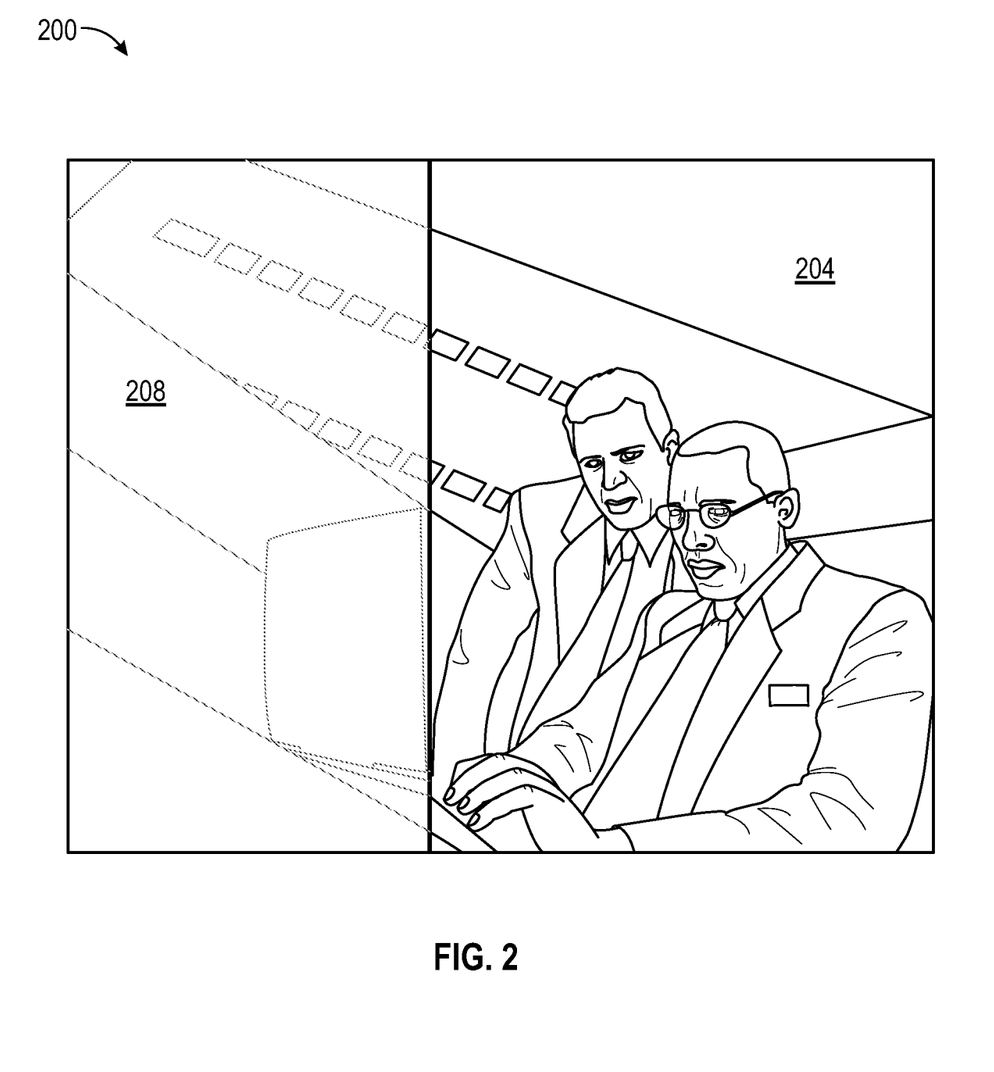
FIG. 2 is an illustration of an exemplary embodiment of a frame having two sub-pictures.

Alternatively or additionally, and further referring to FIG. 1, a sub-picture may be identified by an encoder and/or other hardware and/or software component and/or process as an area, region and/or subdivision of a picture in which greater amounts of motion are detected and/or present; such regions may be identified as sub-pictures can considered significant and coded using lossless coding, while sub-pictures with little or no motion may be coded using lossy coding. An example is show in FIG. 2, where a picture 200 is divided in two sub-pictures: a first region 204 with motion, and third region 208 with no motion. As noted above, in some cases lossless coding may give better compression than lossy coding with that uses transform and quantization. In an alternative or additional example, a picture 200 may be divided into a first region 204 encoded using a first lossless protocol, a second region (not shown) using a second lossless protocol, and a third region using a lossy protocol.

Referring again to FIG. 1, a picture may be divided into sub-pictures, slices, and tiles. Blocks (CTUs) may be coding units that may be coded in intra or inter coding mode. A sub-picture may include a single CTU and/or plurality of CTUs. In an embodiment, each CTU in a subset of CTUs may signal whether lossless coding is used in the CTU; alternatively or additionally, a set of CTUs, such as without limitation a set of contiguously located CTUs may be signaled together.

Lossless and/or lossy coding may be signaled in one or more headers provided to a bitstream. For instance, and without limitation, CTUs may be coded in lossless coding mode by signaling lossless and/or lossy coding mode in a CTU header. Selective use of lossless coding for a sub-set of blocks (CTUs) may alternatively or additionally be signaled at a higher-level syntactic unit. For example, a tile, slice, and/or sub-picture header may signal the use of lossless coding modes for all the CTUs in that syntactic unit. A sub-picture header may be either explicitly present or included by reference using a mechanism such as an identifier of another header such as a previously signaled picture header.

As a non-limiting example, and continuing to refer to FIG. 1, data and/or logic within a sub-picture header, CTU header, and/or other header may include, without limitation, a first bit indicating whether lossless mode signaling is enabled, or in other words whether encoder and/or decoder should signal and/or receive a signal indicating whether lossless and/or lossy mode is being used for the relevant CTU, sub-picture, or the like. Data and/or logic within a sub-picture header, CTU header, and/or other header may include, without limitation, a second bit indicating lossless and/or lossy mode, where a lossless mode is a mode in which relevant CTU, sub-picture, or the like is encoded and decoded using a lossless encoding and decoding protocol as described above. The following is a non-limiting and illustrative example of logic and data that may be employed

```
Sub_picture_header {
    . . .
    . . .
    . . .
    lossless_mode_signaling [1-bit]
    if(lossless_mode_signaling){
    lossless_mode [1 bit];
    }
    . . .
    . . .
    . . .
}
```

Lossy or lossless mode may alternatively or additionally be signaled using a lossless_coding_contraint_flag or the like in a header such as a PPS, SPS, block, sub-block, or other header.

Still referring to FIG. 1, an encoder and/or decoder configured to perform processes described in this disclosure may be configured to signal and/or detect a lossless encoding protocol used, for instance using an identifier and/or bit corresponding to the lossless encoding protocol.

Alternatively or additionally, encoder and/or decoder may be configured to operate a specific lossless encoding and decoding protocol, for instance as consistent with a given standard, release, or other approach to adopting uniform standard. There may be two or more standard protocols, selection of which may be signaled in a bitstream using a sufficient number of bits to encode the two or more potential selections.

With continued reference to FIG. 1, lossless coding protocol may include any protocol for lossless encoding of images, videos, frames, pictures, sub-pictures or the like. As a non-limiting example, encoder and/or decoder may accomplish lossless coding is to bypass a transform coding stage and encode residual directly. This approach, which may be referred to in this disclosure as "transform skip residual coding," may be accomplished by skipping transformation of a residual, as described in further detail below, from spatial into frequency domain by applying a transform from the family of discrete cosine transforms (DCTs), as performed for instance in some forms of block-based hybrid video coding. Lossless encoding and decoding may be performed according to one or more alternative processes and/or protocols, including without limitation processes and/or protocols as proposed at Core Experiment CE3-1 of JVET-Q00069 pertaining to regular and TS residual coding (RRC, TSRC) for lossless coding, and modifications to RRC and TSRC for lossless and lossy operation modes, Core Experiment CE3-2 of JVET-Q0080, pertaining to enabling block differential pulse-code modulation (BDPCM) and high-level techniques for lossless coding, and the combination of BDPCM with different RRC/TSRC techniques, or the like.

With further reference to FIG. 1, an encoder as described in this disclosure may be configured to encode one or more fields using TS residual coding, where one or more fields may include without limitation any picture, sub-picture, coding unit, coding tree unit, tree unit, block, slice, tile, and/or any combination thereof. A decoder as described in this disclosure may be configured to decode one or more fields according to and/or using TS residual coding. In transform skip mode, residuals of a field may be coded in units of non-overlapped subblocks, or other subdivisions, of a given size, such as without limitation a size of four pixels by four pixels. A quantization index of each scan position in a field to be transformed may be coded, instead of coding a last significant scan position; a final subblock and/or subdivision position may be inferred based on levels of previous subdivisions. TS residual coding may perform diagonal scan in a forward manner rather than a reverse manner. Forward scanning order may be applied to scan subblocks within a transform block as well as positions within a subblock and/or subdivision; in an embodiment, there may be no signaling of a final (x, y) position. As a non-limiting example, a coded_sub_block_flag may be coded for every subblock except for a final subblock when all previous flags are equal to 0. sig_coeff_flag context modelling may use a reduced template. A context model of sig_coeff_flag may depend on top and left neighboring values; context model of abs_level_gt1 flag may also depend on left and top sig_coeff_flag values.

Still referring to FIG. 1, and as a non-limiting example, during a first scan pass in a TS residual coding process, a significance flag (sig_coeff_flag), sign flag (coeff_sign_flag), absolute level greater than 1 flag (abs_level_gtx_flag[0]), and parity (par_level_flag) may be coded. For a given scan position, if sig_coeff_flag is equal to 1, then coeff_sign_flag may be coded, followed by the abs_level_gtx_flag[0] (which specifies whether the absolute level is greater than 1). If abs_level_gtx_flag[0] is equal to 1, then the par_level_flag is additionally coded to specify the parity of the absolute level. During a second or subsequent scan pass, for each scan position whose absolute level is greater than 1, up to four abs_level_gtx_flag[i] for i=1 . . . 4 may be coded to indicate if an absolute level at a given position is greater than 3, 5, 7, or 9, respectively. During a third or final "remainder" scan pass, remainder, which may be stored as absolute level abs_remainder may be coded in a bypass mode. Remainder of absolute levels may be binarized using a fixed rice parameter value of 1.

Further referring to FIG. 1, bins in a first scan pass and second or "greater-than-x" scan pass may be context coded until a maximum number of context coded bins in a field, such as without limitation a TU, have been exhausted. A maximum number of context coded bins in a residual block may be limited, in a non-limiting example, to 1.75*block_width*block_height, or equivalently, 1.75 context coded bins per sample position on average. Bins in a last scan pass such as a remainder scan pass as described above, may be bypass coded. A variable, such as without limitation RemCebs, may be first set to a maximum number of context-coded bins for a block or other field and may be decreased by one each time a context-coded bin is coded. In a non-limiting example, while RemCebs is larger than or equal to four, syntax elements in a first coding pass, which may include sig_coeff_flag, coeff_sign_flag, abs_level_gt1_flag and par_level_flag, may be coded using context-coded bins. In some embodiments, if RemCcbs becomes smaller than 4 while coding a first pass, remaining coefficients that have yet to be coded in the first pass may be coded in the remainder scan pass and/or third pass.

Still referring to FIG. 1, after completion of first pass coding, if RemCebs is larger than or equal to four, syntax elements in second coding pass, which may include abs_level_gt3_flag, abs_level_gt5_flag, abs_level_gt7_flag, and abs_level_gt9_flag, may be coded using context coded bins. If the RemCcbs becomes smaller than 4 while coding a second pass, remaining coefficients that have yet to be coded in the second pass may be coded in a remainder and/or third scan pass. In some embodiments, a block coded using TS residual coding may not be coded using BDPCM coding. For a block not coded in the BDPCM mode, a level mapping mechanism may be applied to transform skip residual coding until a maximum number of context coded bins has been reached. Level mapping may use top and left neighboring coefficient levels to predict a current coefficient level in order to reduce signaling cost. For a given residual position, absCoeff may be denoted as an absolute coefficient level before mapping and absCoeffMod may be denoted as a coefficient level after mapping. As a non-limiting example, where X0 denotes an absolute coefficient level of a left neighboring position and X1 denotes an absolute coefficient level of an above neighboring position, a level mapping may be performed as follows:

pred=max($X_0$,$X_1$); if(absCoeff==pred)absCoeff
Mod=1; else absCoeffMod=(absCoeff
Mod<pred)?absCoeff+1:absCoeff absCoeffMod value may then be coded as described above. After all context coded bins have been exhausted, level mapping may be disabled for all remaining scan positions in a current block and/or field and/or subdivision. Three scan passes as described above may be performed for each subblock and/or other subdivision if a coded_subblock_flag is equal to 1, which may indicate that there is at least one non-zero quantized residual in the subblock.

In some embodiments, and still referring to FIG. 1, when transform skip mode is used for a large block, the entire block may be used without zeroing out any values. In addition, transform shift may be removed in transform skip mode. Statistical characteristics of a signal in TS residual coding may be different from those of transform coefficients. Residual coding for transform skip mode may specify a maximum luma and/or chroma block size; as a non-limiting example, settings may permit transform skip mode to be used for luma blocks of size up to MaxTsSize by MaxTsSize, where a value of MaxTsSize may be signaled in a PPS and may have a global maximum possible value such as without limitation 32. When a CU is coded in transform skip mode, its prediction residual may be quantized and coded using a transform skip residual coding process.

With continued reference to FIG. 1, an encoder as described in this disclosure may be configured to encode one or more fields using BDPCM, where one or more fields may include without limitation any picture, sub-picture, coding unit, coding tree unit, tree unit, block, slice, tile, and/or any combination thereof. A decoder as described in this disclosure may be configured to decode one or more fields according to and/or using BDPCM. BDPCM may keep full reconstruction at a pixel level. As a non-limiting example, a prediction process of each pixel with BDPCM may include four main steps, which may predict each pixel using its in-block references, then reconstruct it to be used as in-block reference for subsequent pixels in the rest of the block: (1) in-block pixel prediction, (2) residual calculation, (3) residual quantization, and (4) pixel reconstruction.

Still referring to FIG. 1, in-block pixel prediction may use a plurality of reference pixels to predict each pixel; as a non-limiting example, plurality of reference pixels may include a pixel α at left of the pixel p to be predicted, a pixel β above p, and a pixel γ above and to the left of p. A prediction of p may be formulated, without limitation, as follows:

$$p = \begin{cases} \min(\alpha, \beta), & \text{if } \gamma \leq \max(\alpha, \beta) \\ \max(\alpha, \beta), & \text{if } \gamma \geq \min(\alpha, \beta) \\ \alpha + \beta - \gamma, & \text{Otherwise} \end{cases}$$

Still referring to FIG. 1, once a prediction value has been calculated, its residual may be calculated. Since a residual at this stage may be lossless and inaccessible at a decoder side, it may be denoted as $\tilde{r}$ and calculated as a subtraction of an original pixel value o from prediction p:

$\tilde{r}$=o−p

Further referring to FIG. 1, pixel-level independence may be achieved by skipping a residual transformation and integrating a spatial domain quantization. This may be performed by a linear quantizer Q to calculate a quantized residual value r as follows:

r=Q($\tilde{r}$)

To accommodate a correct rate-distortion ratio, imposed by a Quantizer Parameter (QP), BDPCM may adopt a spatial domain normalization used in a transfer-skip mode method, for instance and without limitation as described above. Quantized residual value r may be transmitted by an encoder.

Still referring to FIG. 1, another state of BDPCM may include pixel reconstruction using p and r from previous steps, which may be performed, for instance and without limitation at or by a decoder, as follows:

c=p+r

Once reconstructed, current pixel may be used as an in-block reference for other pixels within the same block.

A prediction scheme in an BDPCM algorithm may be used where there is a relatively large residual, when an original pixel value is far from its prediction. In screen content, this may occur where in-block references belong to a background layer, while a current pixel belongs to a foreground layer, or vice versa. In this situation, which may be referred to as a "layer transition" situation, available information in references may not be adequate for an accurate prediction. At a sequence level, a BDPCM enable flag may be signaled in an SPS; this flag may, without limitation, be signaled only if a transform skip mode, for instance and without limitation as described above, is enabled in the SPS. When BDPCM is enabled, a flag may be transmitted at a CU level if a CU size is smaller than or equal to MaxTsSize by MaxTsSize in terms of luma samples and if the CU is intra coded, where MaxTsSize is a maximum block size for which a transform skip mode is allowed. This flag may indicate whether regular intra coding or BDPCM is used. If BDPCM is used, a BDPCM prediction direction flag may be transmitted to indicate whether a prediction is horizontal or vertical. Then, a block may be predicted using regular horizontal or vertical intra prediction process with unfiltered reference samples.

Figure 3:
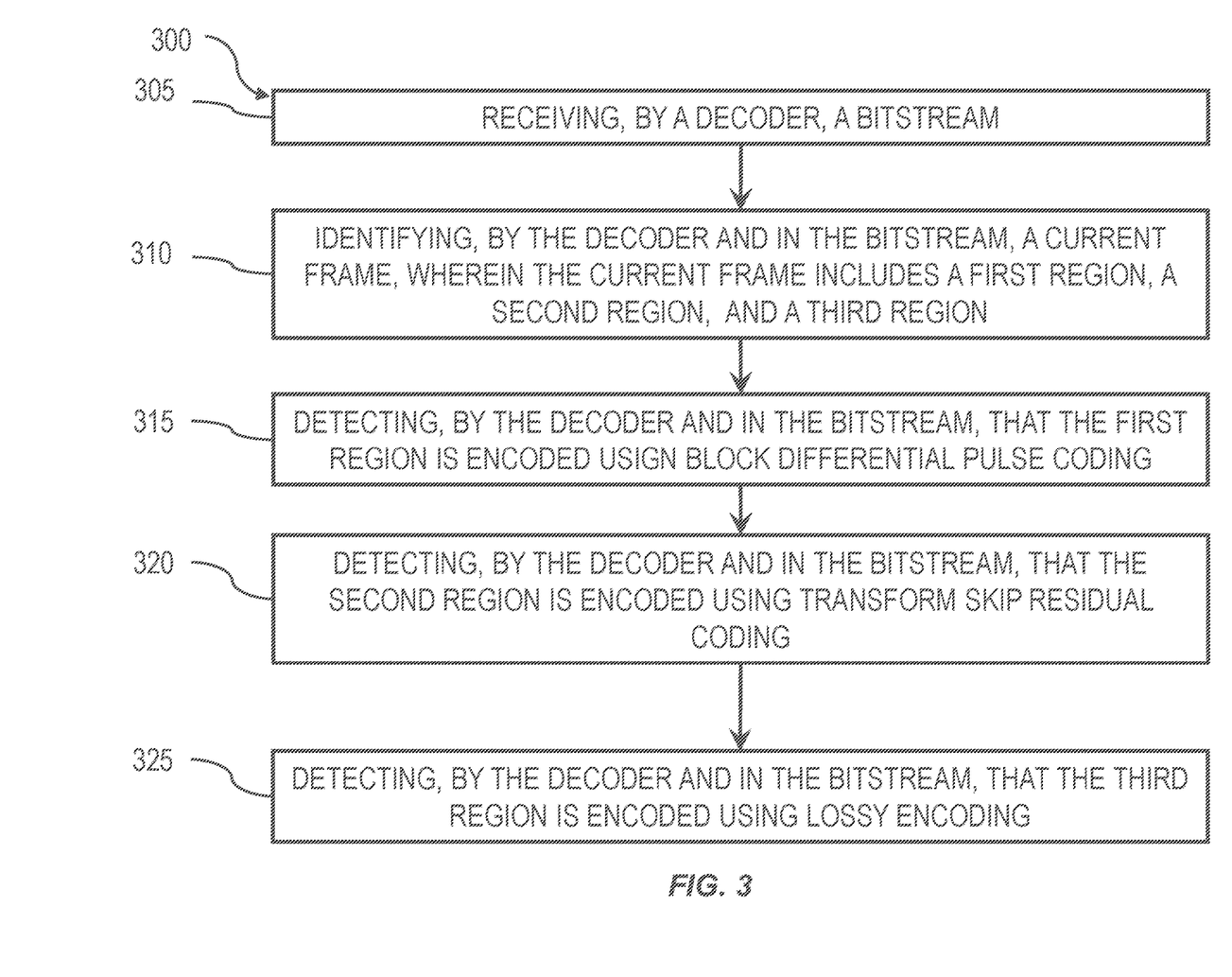
FIG. 3 is a process flow diagram illustrating an example process for decoding a video according to some implementations of the current subject matter.

Referring now to FIG. 3, an exemplary embodiment of a method 300 of combined lossless and lossy coding is illustrated. At step 305, a decoder receives a bitstream. At step 310, decoder identifies a current frame in bitstream. Current frame may include a first region, a second region, and a third region, any of which may include any region as described above; regions may be flagged using frame header information and/or delineated or otherwise described using coordinates, geometric information, identifications of blocks and/or CTUs included in each region, or the like. In an embodiment, decoder may identify only two regions of first region, second region, and third region in current frame, while a remaining region may be identified as remaining tiles, slices, blocks, CTUs, or the like of current frame. There may be more than three regions; method 300 may include any processing step as described in this disclosure being performed with regard to any additional regions.

At step 315, and with continued reference to FIG. 3, decoder detects, in the bitstream, an indication that the first region is encoded according to block differential pulse code modulation; this may be performed, without limitation, as described above in reference to FIGS. 1-2. Detection may include and/or be preceded by detection that block differential pulse code modulation is enabled, for instance as described above. In an embodiment, bitstream may include a sub-picture header corresponding to first region. Detection may include detecting indication that at least a first region is encoded according to block differential pulse code modulation in a sub-picture and/or region-specific header. Sub-picture header may be explicitly included in data corresponding to current frame. For instance, and without limitation, sps_bdpcm_enabled_flag may be set to 1 in an SPS and/or other header if bdpcm is enabled for a sequence. sps_bdpcm_enabled_flag equal to 1 may specify that an intra_bdpcm_luma_flag and/or an intra_bdpcm_chroma_flag may be present in coding unit and/or other field-specific syntax for intra coding units and/or other fields. sps_bdpcm_enabled_flag equal to 0 may specify that intra_bdpcm_luma_flag and/or intra_bdpcm_chroma_flag are not present in coding unit and/or other field-specific syntax for intra coding units and/or other fields. When not present, a value of sps_bdpcm_enabled_flag may be inferred to be equal to 0. In an embodiment, a gci_no_bdpcm_constraint_flag equal to 1 may specify that sps_bdpcm_enabled_flag for all pictures in a given set, which may be defined without limitation by an OlsInScope parameter, shall be equal to 0. gci_no_bdpcm_constraint_flag equal to 0 may not impose such a constraint. As a further non-limiting example, intra_bdpcm_luma_flag equal to 1 may specify that BDPCM may be applied to a current luma coding block, and/or other field at a location (x0, y0), i.e. the transform is skipped; a luma intra prediction mode may be specified by intra_bdpcm_luma_dir_flag. For instance and without limitation, intra_bdpcm_luma_flag equal to 0 may specify that BDPCM is not applied to a current luma coding block, and/or other field, at a location (x0, y0). When intra_bdpcm_luma_flag is not present it may be inferred to be equal to 0. A variable BdpcmFlag[x][y][cIdx] may be set equal to intra_bdpcm_luma_flag for x=x0 . . . x0+cbWidth−1, y=y0 . . . y0+cbHeight−1 and cIdx=0. intra_bdpcm_luma_dir_flag equal to 0 may specify that a BDPCM prediction direction is horizontal. intra_bdpcm_luma_dir_flag equal to 1 may specify that a BDPCM prediction direction is vertical. Variable BdpcmDir[x][y][cIdx] may be set equal to intra_bdpcm_luma_dir_flag for x=x0 . . . x0+cbWidth−1, y=y0 . . . y0+cbHeight−1 and cIdx=0. Sub-picture and/or region may be included by reference to an identifier of a sub-picture header corresponding to a third sub-picture and/or other element of current frame.

At step 320, and with continued reference to FIG. 3, decoder detects, in the bitstream, an indication that second region is encoded according to transform skip residual coding; this may be performed, without limitation, as described above in reference to FIGS. 1-2. Detection may include and/or be preceded by detection that transform skip residual coding is enabled, for instance as described above. In an embodiment, bitstream may include a sub-picture header corresponding to first region. Detection may include detecting indication that at least a first region is encoded according to a transform skip residual coding protocol in a sub-picture header; this may include a transform skip enable flag. For instance, and without limitation, a sh_ts_residual_coding_disabled_flag equal to 1 may specify that a residual_coding syntax structure may be used to parse the residual samples of a transform skip block for a current slice and/or other field. sh_ts_residual_coding_disabled_flag equal to 0 may specify that a residual_ts_coding syntax structure may be used to parse residual samples of a transform skip block for a current slice. When sh_ts_residual_coding_disabled_flag is not present, it may be inferred to be equal to 0. transform_skip_flag[x0][y0][cIdx] may specify whether a transform may be applied to an associated transform block or not. Array indices x0, y0 may specify a location (x0, y0) of a top-left luma sample of a considered transform block relative to a top-left luma sample of a picture. An array index cIdx may specify an indicator for a colour component; it may, for instance, be equal to 0 for Y, 1 for Cb, and 2 for Cr. transform_skip_flag[x0][y0][cIdx] equal to 1 may specify that no transform may be applied to an associated transform block. transform_skip_flag[x0][y0][cIdx] equal to 0 may specify that a decision whether transform is applied to the associated transform block or not depends on other syntax elements. Transform skip mode may alternatively or additionally be signaled implicitly. For instance, when transform_skip_flag[x0][y0][cIdx] is not present, it may be inferred as follows: If BdpcmFlag[x0][y0][cIdx] is equal to 1 transform_skip_flag[x0][y0][cIdx] may be inferred to be equal to 1; otherwise, where BdpcmFlag[x0][y0][cIdx] is equal to 0, transform_skip_flag[x0][y0][cIdx] may be inferred to be equal to 0. Sub-picture and/or region-specific header may be explicitly included in data corresponding to current frame. Sub-picture and/or region may be included by reference to an identifier of a sub-picture header corresponding to a third sub-picture and/or other element of current frame.

At step 325, and with continued reference to FIG. 3, decoder detects that third region is encoded according to a lossy encoding protocol decode third region according to a lossy decoding protocol corresponding to the lossless encoding protocol; this may be performed according to any lossy decoding process described herein, including processes including DCT and other processes as described below. Bitstream may include a sub-picture and/or region-specific header corresponding to the third region and detecting may include the indication that the third region is encoded according to a lossy encoding protocol in the sub-picture header. Sub-picture and/or region-specific header may be explicitly included in data corresponding to the current frame. Sub-picture and/or region-specific header may be included by reference to an identifier of a sub-picture and/or region-specific header corresponding to a third sub-picture, for instance as described above. In an embodiment, decoder may be configured to decode first region using a first processor thread, as defined above, and decode third region element using a second processor thread.

Continuing to refer to FIG. 3, decoder may decode current frame. Decoding current frame may include decoding first region using a BDPCM decoding protocol corresponding to BDPCM encoding protocol. Decoding current frame may include decoding second region using a transfer-skip residual decoding protocol corresponding to a transfer-skip residual encoding protocol. Decoding current frame may include decoding third region using a lossy decoding protocol corresponding to lossy encoding protocol.

Figure 4:
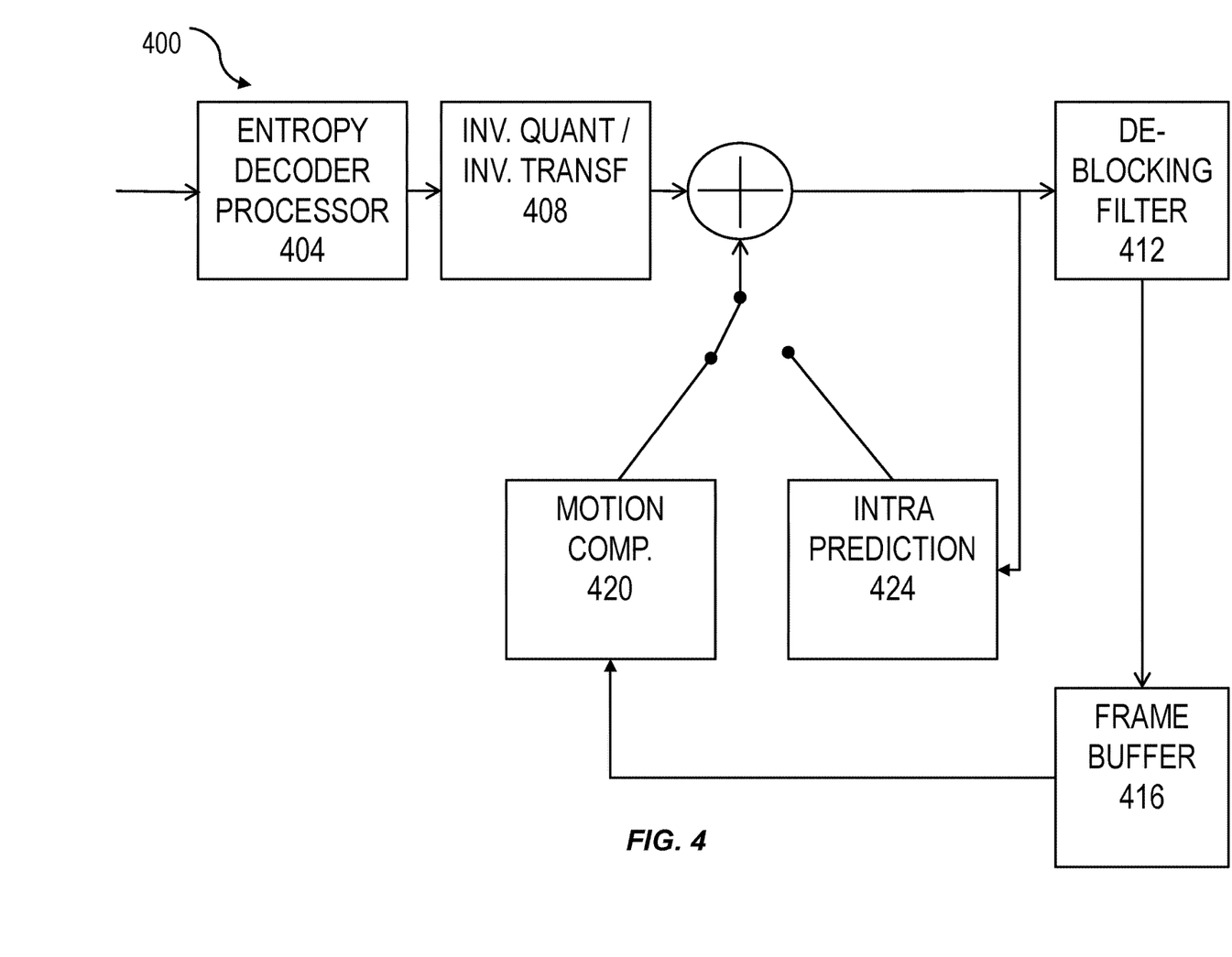
FIG. 4 is a system block diagram illustrating an example decoder capable of decoding a bit stream according to some implementations of the current subject matter.

Still referring to FIG. 3, the decoder may include an entropy decoder processor configured to receive the bit stream and decode the bitstream into quantized coefficients, an inverse quantization and inverse transformation processor configured to process the quantized coefficients including performing an inverse discrete cosine, a deblocking filter, a frame buffer, and an intra prediction processor. At least one of first region, second region, and third region may form part of a quadtree plus binary decision tree. At least one of first region, second region, and third region includes a coding tree unit. In some implementations, at least one of first region, second region, and third region may include a coding tree unit (CTU), a coding unit (CU), or a prediction unit (PU). FIG. 4 is a system block diagram illustrating an example decoder 400 capable of decoding a bitstream 428 using combined lossy and lossless coding protocols. Decoder 400 may include an entropy decoder processor 404, an inverse quantization and inverse transformation processor 408, a deblocking filter 412, a frame buffer 416, a motion compensation processor 420 and/or an intra prediction processor 424.

In operation, and still referring to FIG. 4, bit stream 428 may be received by decoder 400 and input to entropy decoder processor 404, which may entropy decode portions of bit stream into quantized coefficients. Quantized coefficients may be provided to inverse quantization and inverse transformation processor 408, which may perform inverse quantization and inverse transformation to create a residual signal, which may be added to an output of motion compensation processor 420 or intra prediction processor 424 according to a processing mode. An output of the motion compensation processor 420 and intra prediction processor 424 may include a block prediction based on a previously decoded block. A sum of prediction and residual may be processed by deblocking filter 412 and stored in a frame buffer 416.

With continued reference to FIG. 4 decoder 400 may be designed and/or configured to perform any method, method step, or sequence of method steps in any embodiment described in this disclosure, in any order and with any degree of repetition. For instance, decoder 400 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Decoder 400 may perform any step or sequence of steps as described in this disclosure in parallel, such as simultaneously and/or substantially simultaneously performing a step two or more times using two or more parallel threads, processor cores, or the like;

division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 5:
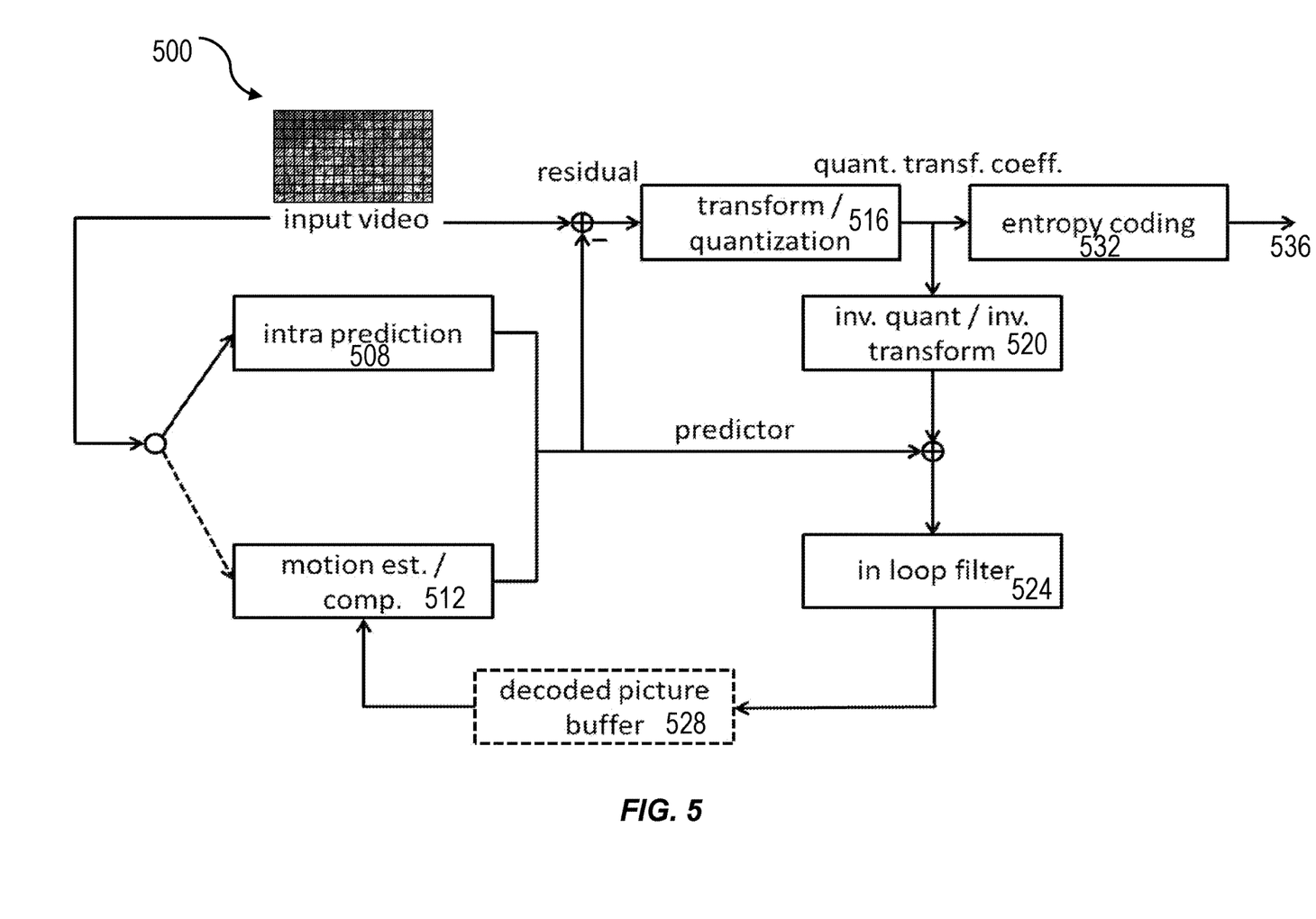
FIG. 5 is a process flow diagram illustrating an example process of encoding a video according to some implementations of the current subject matter.

FIG. 5 is a system block diagram illustrating an exemplary embodiment of a video encoder 500 capable of constructing a motion vector candidate list including adding a single global motion vector candidate to the motion vector candidate list. Example video encoder 500 may receive an input video 504, which may be initially segmented and/or dividing according to a processing scheme, such as a tree-structured macro block partitioning scheme (e.g., quad-tree plus binary tree). An example of a tree-structured macro block partitioning scheme may include partitioning a picture frame into large block elements called coding tree units (CTU). In some implementations, each CTU may be further partitioned one or more times into a number of sub-blocks called coding units (CU). A final result of this portioning may include a group of sub-blocks that may be called predictive units (PU). Transform units (TU) may also be utilized.

Still referring to FIG. 5, example video encoder 500 may include an intra prediction processor 512, a motion estimation/compensation processor 512 (also referred to as an inter prediction processor) capable of constructing a motion vector candidate list including adding a single global motion vector candidate to the motion vector candidate list, a transform/quantization processor 516, an inverse quantization/inverse transform processor 520, an in-loop filter 524, a decoded picture buffer 528, and/or an entropy coding processor 532. Bit stream parameters may be input to entropy coding processor 532 for inclusion in an output bit stream 536.

In operation, and with continued reference to FIG. 5, for each block of a frame of input video 504, whether to process block via intra picture prediction or using motion estimation/compensation may be determined. Block may be provided to intra prediction processor 508 or motion estimation/compensation processor 512. If block is to be processed via intra prediction, intra prediction processor 508 may perform processing to output a predictor. If block is to be processed via motion estimation/compensation, motion estimation/compensation processor 512 may perform processing including constructing a motion vector candidate list including adding a single global motion vector candidate to the motion vector candidate list, if applicable.

Still referring to FIG. 5, a residual may be formed by subtracting predictor from input video. Residual may be received by transform/quantization processor 516, which may perform transformation processing (e.g., discrete cosine transform (DCT)) to produce coefficients, which may be quantized. Quantized coefficients and any associated signaling information may be provided to entropy coding processor 532 for entropy encoding and inclusion in an output bit stream 536. Entropy encoding processor 532 may support encoding of signaling information related to encoding a current block. In addition, quantized coefficients may be provided to inverse quantization/inverse transformation processor 520, which may reproduce pixels, which may be combined with predictor and processed by in loop filter 524, an output of which may be stored in decoded picture buffer 528 for use by motion estimation/compensation processor 512 that is capable of constructing a motion vector candidate list including adding a single global motion vector candidate to the motion vector candidate list.

Further referencing FIG. 5, although a few variations have been described in detail above, other modifications or additions are possible. For example, in some implementations, current blocks may include any symmetric blocks (8×8, 16×16, 32×32, 64×64, 128×128, and the like) as well as any asymmetric block (8×4, 16×8, and the like).

In some implementations, and still referring to FIG. 5, a quadtree plus binary decision tree (QTBT) may be implemented. In QTBT, at a Coding Tree Unit level, partition parameters of QTBT may be dynamically derived to adapt to local characteristics without transmitting any overhead. Subsequently, at a Coding Unit level, a joint-classifier decision tree structure may eliminate unnecessary iterations and control risk of false prediction. In some implementations, LTR frame block update mode may be available as an additional option available at every leaf node of a QTBT.

In some implementations, and still referring to FIG. 5, additional syntax elements may be signaled at different hierarchy levels of a bitstream. For example, a flag may be enabled for an entire sequence by including an enable flag coded in a Sequence Parameter Set (SPS). Further, a CTU flag may be coded at a coding tree unit (CTU) level.

With continued reference to FIG. 5, non-transitory computer program products (i.e., physically embodied computer program products) may store instructions, which when executed by one or more data processors of one or more computing systems, causes at least one data processor to perform operations, and/or steps thereof described in this disclosure, including without limitation any operations described above 400 and/or encoder 500 may be configured to perform. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, or the like.

With continued reference to FIG. 5, encoder 500, decoder 400, and/or circuitry thereof may be designed and/or configured to perform any method, method step, or sequence of method steps in any embodiment described in this disclosure, in any order and with any degree of repetition. For instance, encoder 500, decoder 400, and/or circuitry thereof may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Encoder 500, decoder 400, and/or circuitry thereof may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 6:
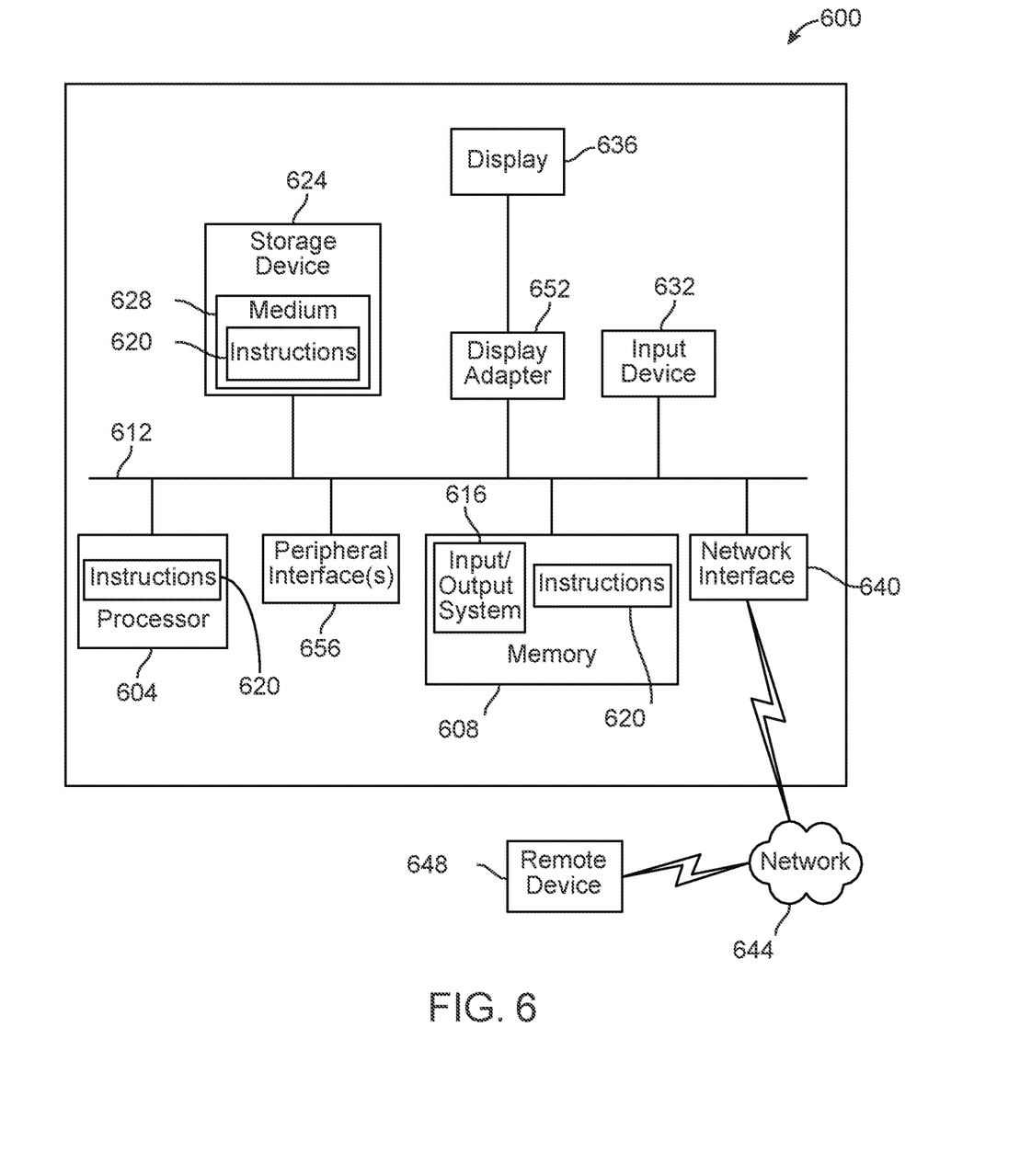
FIG. 6 is a block diagram of a computing system that can be used to implement any one or more of the methodologies disclosed herein and any one or more portions thereof.

FIG. 6 shows a diagrammatic representation of one embodiment of a computing device in the exemplary form of a computer system 600 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Processor 604 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 604 may be organized according to Von Neumann and/or Harvard architecture as a non-limiting example. Processor 604 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC).

Memory 608 may include various components (e.g., machine-readable media) including, but not limited to, a random-access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure. In another example, memory 608 may further include any number of program modules including, but not limited to, an operating system, one or more application programs, other program modules, program data, and any combinations thereof.

Computer system 600 may also include a storage device 624. Examples of a storage device (e.g., storage device 624) include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector (not shown)). Particularly, storage device 624 and an associated machine-readable medium 628 may provide nonvolatile and/or volatile storage of machine-readable instructions, data structures, program modules, and/or other data for computer system 600. In one example, software 620 may reside, completely or partially, within machine-readable medium 628. In another example, software 620 may reside, completely or partially, within processor 604.

Computer system 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to computer system 600 via storage device 624 (e.g., a removable disk drive, a flash drive, etc.) and/or network interface device 640. A network interface device, such as network interface device 640, may be utilized for connecting computer system 600 to one or more of a variety of networks, such as network 644, and one or more remote devices 648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from computer system 600 via network interface device 640.

Computer system 600 may further include a video display adapter 652 for communicating a displayable image to a display device, such as display device 636. Examples of a display device include, but are not limited to, a liquid crystal display (LCD), a cathode ray tube (CRT), a plasma display, a light emitting diode (LED) display, and any combinations thereof.

Display adapter 652 and display device 636 may be utilized in combination with processor 604 to provide graphical representations of aspects of the present disclosure. In addition to a display device, computer system 600 may include one or more other peripheral output devices including, but not limited to, an audio speaker, a printer, and any combinations thereof. Such peripheral output devices may be connected to bus 612 via a peripheral interface 656.

Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An encoder configured to:
   receive a video signal;
   encode a bitstream for decoding by a compliant decoder, the decoder configured to:
   receive the encoded bitstream including a header and a coded picture;
   determine, using the header, a location of a first independently coded sub-picture in the coded picture and a location of a second independently coded sub-picture in the picture, the first sub-picture comprising a first plurality of CTUs in the picture and the second sub-picture comprising a second plurality of CTUs in the picture;
   determine that the first sub-picture is coded using a lossless coding protocol;
   decode the first sub-picture using the lossless coding protocol;
   determine that the second sub-picture is coded using a lossy coding protocol; and
   decode the second sub-picture using the lossy coding protocol.

2. The encoder of claim 1 wherein the lossy protocol uses a transform and quantization and the lossless protocol does not use a transform and quantization.

3. The encoder of claim 1 wherein the coded picture includes a third independent sub-picture comprising a third plurality of CTUs, the third sub-picture being coded using BDPCM.

4. The encoder of claim 1, wherein the independently coded sub-picture comprises a plurality of contiguous CTUs.

5. A non-transitory computer-readable recording medium storing an encoded bitstream which is decodable by a decoding method, the method comprising:
   receiving the encoded bitstream including a header and a coded picture;
   determining, using the header, a location of a first independently coded sub-picture in the coded picture and a location of a second independently coded sub-picture in the picture, the first sub-picture comprising a first plurality of CTUs in the picture and the second sub-picture comprising a second plurality of CTUs in the picture;
   determining that the first sub-picture is coded using a lossless coding protocol;
   decoding the first sub-picture using the lossless coding protocol;
   determining that the second sub-picture is coded using a lossy coding protocol; and
   decoding the second sub-picture using the lossy coding protocol.

6. The non-transitory computer readable recording medium of claim 5, wherein the lossy protocol uses a transform and quantization and the lossless protocol does not use a transform and quantization.

7. The non-transitory computer readable recording medium of claim 5, wherein the coded picture includes a third independent sub-picture comprising a third plurality of CTUs, the third sub-picture being coded using BDPCM.

8. The non-transitory computer readable recording medium of claim 5, wherein the independently coded sub-picture comprises a plurality of contiguous CTUs.

* * * * *